United States Patent
Cope et al.

(10) Patent No.: US 7,470,867 B1
(45) Date of Patent: Dec. 30, 2008

(54) MODULAR ELECTRONICS LABORATORY WITH IMPROVED STRUCTURE FOR ROUTING OF POWER AND DATA

(75) Inventors: William J. Cope, San Jose, CA (US); Daniel O. Hoffman, San Carlos, CA (US)

(73) Assignee: Network Appliance, Inc., Sunnyvale, CA (US)

( * ) Notice: Subject to any disclaimer, the term of this patent is extended or adjusted under 35 U.S.C. 154(b) by 939 days.

(21) Appl. No.: 10/423,556

(22) Filed: Apr. 25, 2003

(51) Int. Cl.
*H02B 1/40* (2006.01)

(52) U.S. Cl. ............... 174/480; 174/68.1; 174/101; 174/481; 248/49; 248/68.1

(58) Field of Classification Search .......... 174/480, 174/481, 491, 494, 500, 503, 68.1, 68.3, 174/72 R, 95, 484; 385/134, 135; 248/49; 361/611, 624, 637, 650; 439/212, 213; 52/220.1, 52/220.3, 220.5, 220.7, 220.2
See application file for complete search history.

(56) References Cited

U.S. PATENT DOCUMENTS

| | | | | |
|---|---|---|---|---|
| 5,123,618 A | * | 6/1992 | Guterman et al. | 248/49 |
| 5,564,658 A | * | 10/1996 | Rinderer | 248/49 |
| 5,730,400 A | * | 3/1998 | Rinderer et al. | 248/49 |
| 5,868,361 A | * | 2/1999 | Rinderer | 248/49 |
| 6,198,047 B1 | * | 3/2001 | Barr | 174/68.3 |
| 6,252,171 B1 | * | 6/2001 | Barr | 174/95 |
| 6,313,405 B1 | * | 11/2001 | Rinderer | 174/68.3 |
| 6,365,830 B1 | * | 4/2002 | Snider et al. | 174/484 |
| 6,483,025 B1 | * | 11/2002 | Samsi et al. | 174/68.3 |
| 6,521,835 B1 | * | 2/2003 | Walsh | 174/68.3 |
| 6,547,192 B2 | * | 4/2003 | Rinderer et al. | 248/49 |

* cited by examiner

*Primary Examiner*—Angel R Estrada
(74) *Attorney, Agent, or Firm*—Blakely, Sokoloff, Taylor & Zafman LLP

(57) ABSTRACT

A electronics laboratory includes improved infrastructure for routing power and network data. The laboratory includes a number of work areas, each including a group of interconnected electronic devices arranged in a row. Two or more groups of interconnected electronic devices may also be interconnected. The infrastructure includes, for each work area, a structure comprising a bus duct segment suspended above the row of electronic devices, a plurality of power outlet modules mounted to the bus duct segment, a plurality of rigid members mounted to the bus duct segment, and a plurality of data line connectors, each mounted to a separate one of the rigid members adjacent to the bus duct segment, each to couple a first data line to a second data line, to transport data between two or more of the electronic devices.

30 Claims, 14 Drawing Sheets

US 7,470,867 B1

MODULAR ELECTRONICS LABORATORY WITH IMPROVED STRUCTURE FOR ROUTING OF POWER AND DATA

FIELD OF THE INVENTION

At least one embodiment of the present invention pertains to the design of facilities for testing and/or evaluating electronics equipment, and more particularly, to a modular electronics laboratory with improved infrastructure for routing power and network data.

BACKGROUND

Business enterprises that design and manufacture computer-related equipment and other electronics equipment often maintain and operate laboratories ("labs") to test and evaluate technology. For example, a company which designs or manufactures such equipment may have one or more labs on-site to evaluate different design concepts or to assess the quality of manufacture of their products. A continuing problem for businesses which use these labs is how to create an efficient design for such a lab. In particular, it is desirable to have an electronics lab that makes efficient use of space while also allowing personnel to move about the lab freely and to easily access equipment for purposes of making repairs, upgrades and other services.

A lab may include a large number of electronic devices, such as computers (e.g., clients, servers, and/or standalone computers), data storage devices (e.g., disk drives), switches, routers and/or other communication devices, etc. To conserve space, the devices may be stacked in rows of racks and/or cabinets. Groups of devices in the lab may be connected together and/or to devices outside the lab, to form a network or multiple networks. These connections, along with the need to provide power to all the equipment, often require a substantial amount of transmission lines (cables) throughout the lab to transmit power and data. The cables consume valuable space and can make access to the equipment difficult.

To handle this problem, some electronics labs are designed to have raised portions of floor, on which the electronics equipment is placed, with the power and/or data cables being routed under these raised floor portions. One problem with this approach is that replacement of cables or modification of cable routing can be very time-consuming and labor-intensive. Also, the raised floor portions can make it difficult to move equipment around the lab. This approach, therefore, is not very flexible.

Another approach is to use some type of structure to support power and data cabling overhead. For example, an overhead bus duct system may be used to route power throughout the lab, while a separate overhead support structure is used to support data cabling. This approach, however, tends to create operational and visual clutter overhead and sometimes interferes with air conditioning and lighting. What is needed, therefore, is an improved design for an electronics lab which addresses these and other problems.

SUMMARY OF THE INVENTION

The present invention includes a structure that comprises a bus duct segment, a plurality of rigid members mounted to the bus duct segment, and a plurality of data line connectors. The bus duct segment is suspended above the electronic devices, to transfer power to at least one of the electronic devices. Each of the data line connectors is mounted to a separate one of the rigid members. Each of the data line connectors is to couple a first data line to a second data line, to transport data between two or more of the electronic devices.

Other features of the present invention will be apparent from the accompanying drawings and from the detailed description which follows.

BRIEF DESCRIPTION OF THE DRAWINGS

One or more embodiments of the present invention are illustrated by way of example and not limitation in the figures of the accompanying drawings, in which like references indicate similar elements and in which.

DETAILED DESCRIPTION

A modular electronics lab with improved infrastructure for routing power and network data is described. Note that in this description, references to "one embodiment" or "an embodiment" mean that the feature being referred to is included in at least one embodiment of the present invention. Further, separate references to "one embodiment" or "an embodiment" in this description do not necessarily refer to the same embodiment; however, such embodiments are also not mutually exclusive unless so stated, and except as will be readily apparent to those skilled in the art from the description. For example, a feature, structure, act, etc. described in one embodiment may also be included in other embodiments. Thus, the present invention can include a variety of combinations and/or integrations of the embodiments described herein.

As described in greater detail below, an improved electronics lab is designed to include a number of work areas. Each work area can include multiple electronic devices and may be dedicated to a particular project or study. The lab includes a cost- and space-efficient power and data routing structure, which uses a single overhead spine-and-rib structure to route power and data in each work area. The structure provides numerous advantages, as will become apparent from the following description. For example, the structure is cost effective from both an initial and ongoing cost standpoint. The single overhead spine-and-rib approach is more space-efficient and less expensive than a structure that uses separate spines for power and data. The power and data routing structure described below allows power and data conductors to be run at essentially the same optimal height, which facilitates servicing by technicians, while avoiding floor clutter and reducing ceiling clutter compared to prior systems. The modular nature of the structure also allows power and data modules to be easily changed or added, making the overall routing configuration of the lab highly flexible. The structure also allows more room and flexibility for lighting and air conditioning placement.

Figure 1:
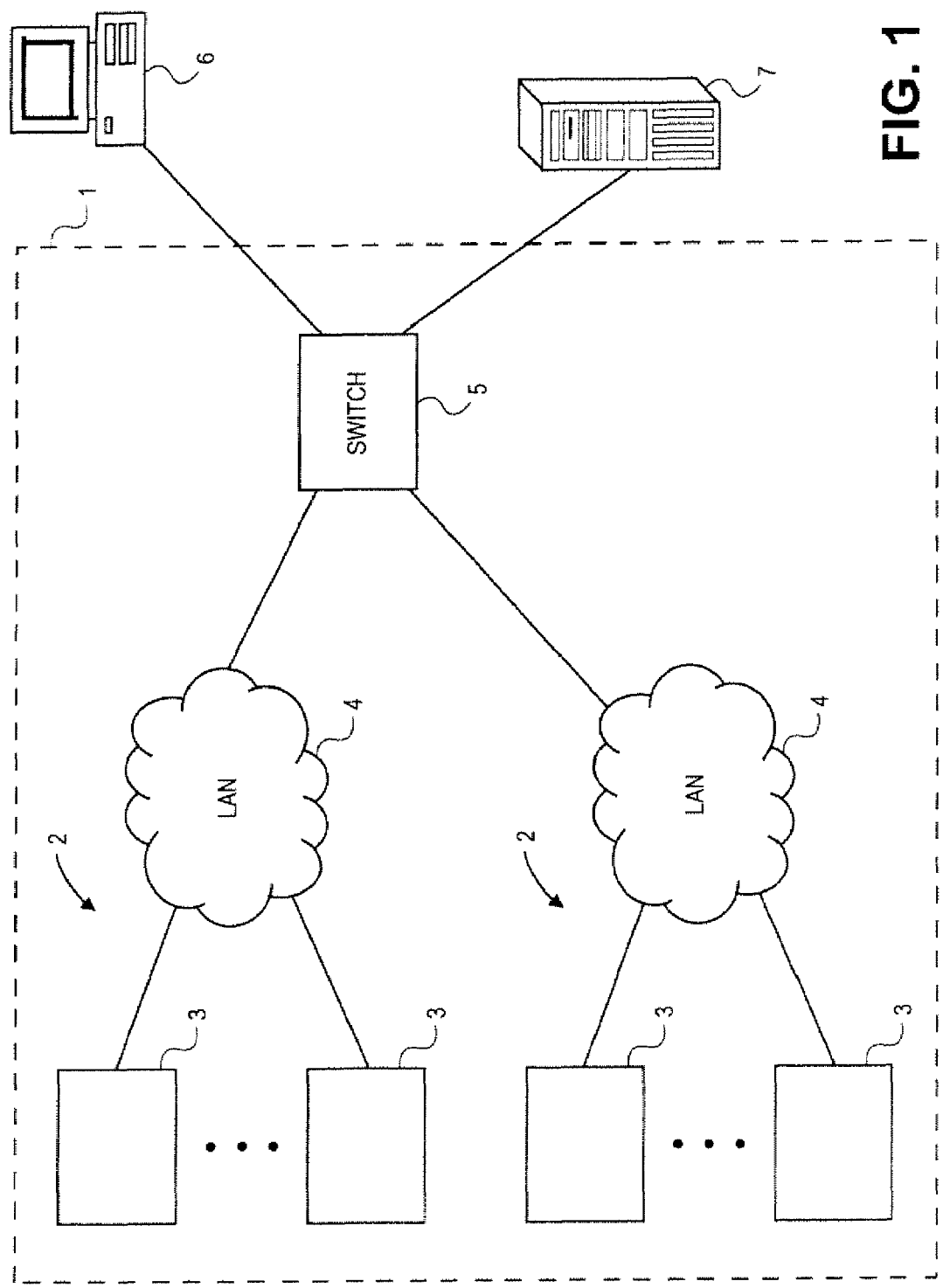
FIG. 1 is a block diagram showing a topological arrangement of equipment in an electronics lab.

Refer now to FIG. 1, which shows an example of a topological arrangement of equipment in an electronics lab. In the illustrated configuration, the lab 1 includes one or more groups 2 of electronic devices 3, where the devices 3 in each group 2 are connected to each other on a separate LAN 4. The devices 3 can be of any type or types of electronics or electronics-related devices that one might find in an electronics lab. For example, the devices 3 might include one or more programmable general- or special-purpose computers (e.g., servers, clients), data storage devices or redundant groups of storage devices, network communication devices (e.g., switches, routers, bridges, modems), etc, or any combination thereof. In just one of many possible specific applications, the lab 1 might be used to evaluate file server systems, for example. In that case, the devices 3 in each group 2 might include one or more file server heads ("filers") and one or more separate disk drive enclosures, each containing multiple high-capacity disk drives controlled by the filers. Of course, many other possible applications for an electronics lab can be envisioned.

In the lab 1 shown in FIG. 1, each group 2 of devices 3 is connected on a master network via a switch 5. The switch 5 provides access to devices 3 to computer systems outside the lab 1, such as one or more clients 6 and one or more servers 7. In the case of a file server system, for example, the switch 5 may enable clients 6 and servers 7 outside the lab 1 to access files stored in disk drives managed by one or more file server heads in the lab 1. It will be recognized that many other possible equipment configurations can be used in any given lab setting. Hence, in various different embodiments, other network configurations may be used; some devices may not be connected to any network; and/or, other types of devices may be included.

Figure 2:
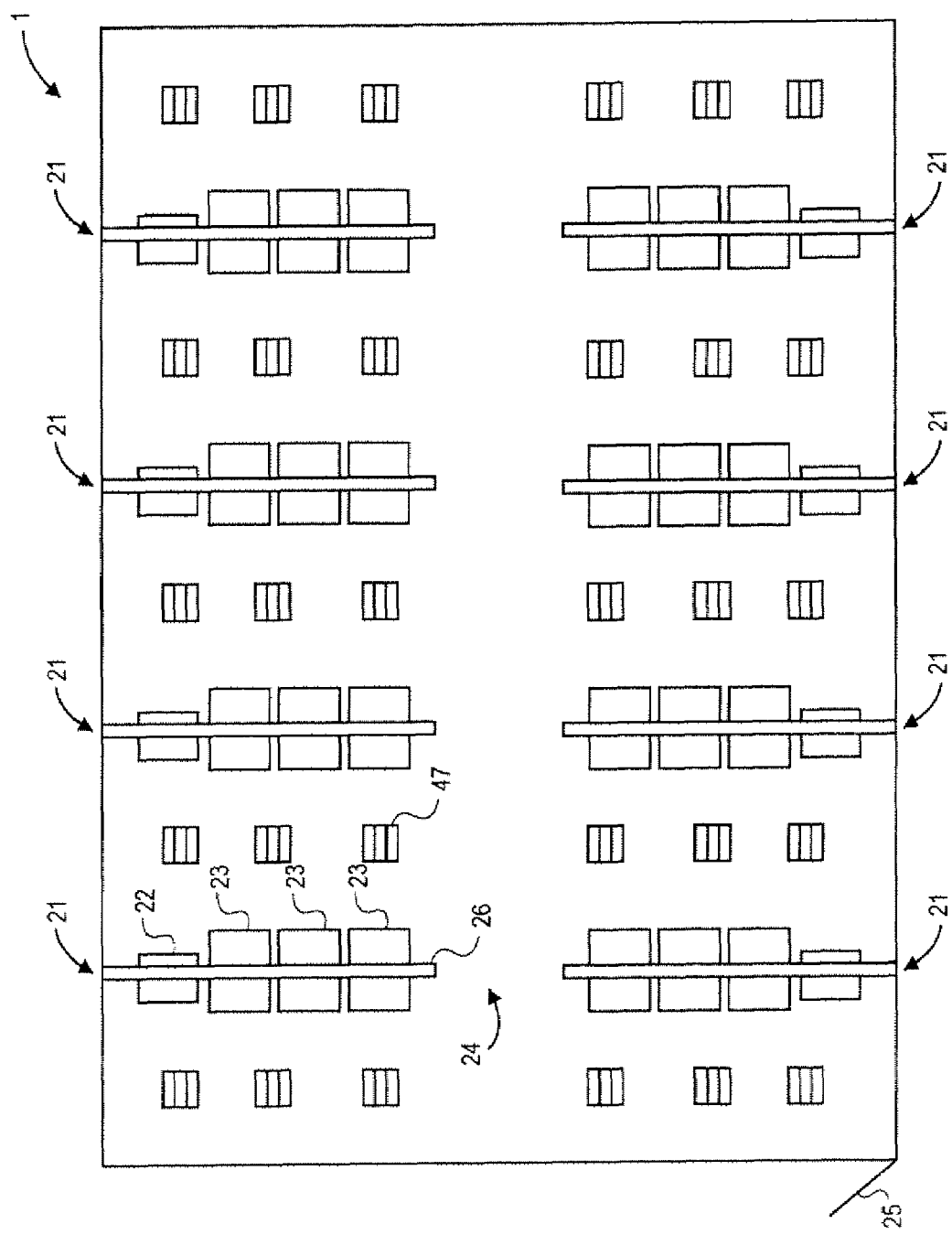
FIG. 2 is a floor plan showing the layout of an electronics lab.

FIG. 2 schematically shows the physical layout of the electronics lab 1 from a "bird's eye" view, according to certain embodiments of the invention. The layout of the lab 1 is designed to facilitate a number of concurrent, ongoing projects and/or studies, allowing for space-efficient grouping of devices involved in the same project or study. Specifically, the lab 1 is organized into multiple work areas 21, where each work area 21 includes a group of electronic devices (not shown in FIG. 2), which may be of any of various types. Each work area 21 can be dedicated to a different project or study.

Most of the electronic devices involved in the various projects/studies are contained or mounted in one or more fixed vertical mounting racks 22 and/or one or more movable equipment cabinets 23, such as are commonly used in electronics labs. The racks 22 and/or cabinets 23 are arranged in a single row for each work area 21. Each rack 22 and cabinet 23 contains one or more shelves or other mounting structure, on which electronics devices can be vertically stacked. In the illustrated embodiment, the rows of racks 22 and cabinets 23 are arranged substantially parallel to each other, on both sides of a center aisle 24. Access to the lab 1 by personnel is through a main door 25. The lab 1 may also include other doors and/or windows (not shown).

The types of devices in the lab and/or the topological arrangement of devices in the lab 1 can be the same or similar to that discussed above regarding FIG. 1, although not necessarily so. That is, the devices in each work area 21 may be connected to each other on a LAN or in some other manner, and/or devices in different work areas 21 may also be connected to each other through a switch or other connection device(s).

To efficiently route power and data under these circumstances, the lab 1 includes power and data routing structure that includes, in each work area 21, a single overhead spine-and-rib structure 26 that is suspended above the electronics equipment, parallel to the row of racks/cabinets.

Figure 3A:
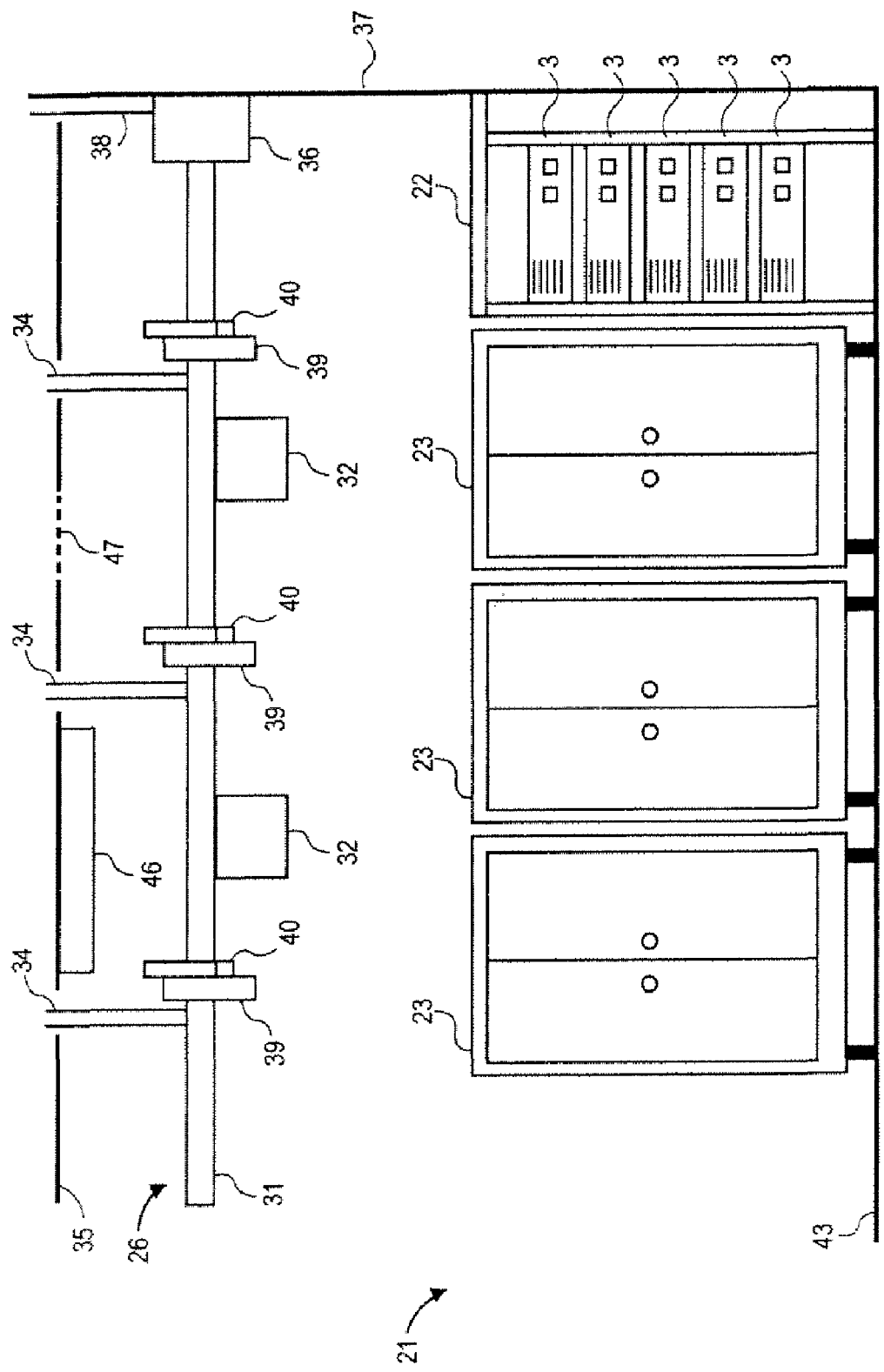
FIG. 3A shows a side view of a support structure to provide overhead support of power and data routing in the electronics lab.
Figure 3B:
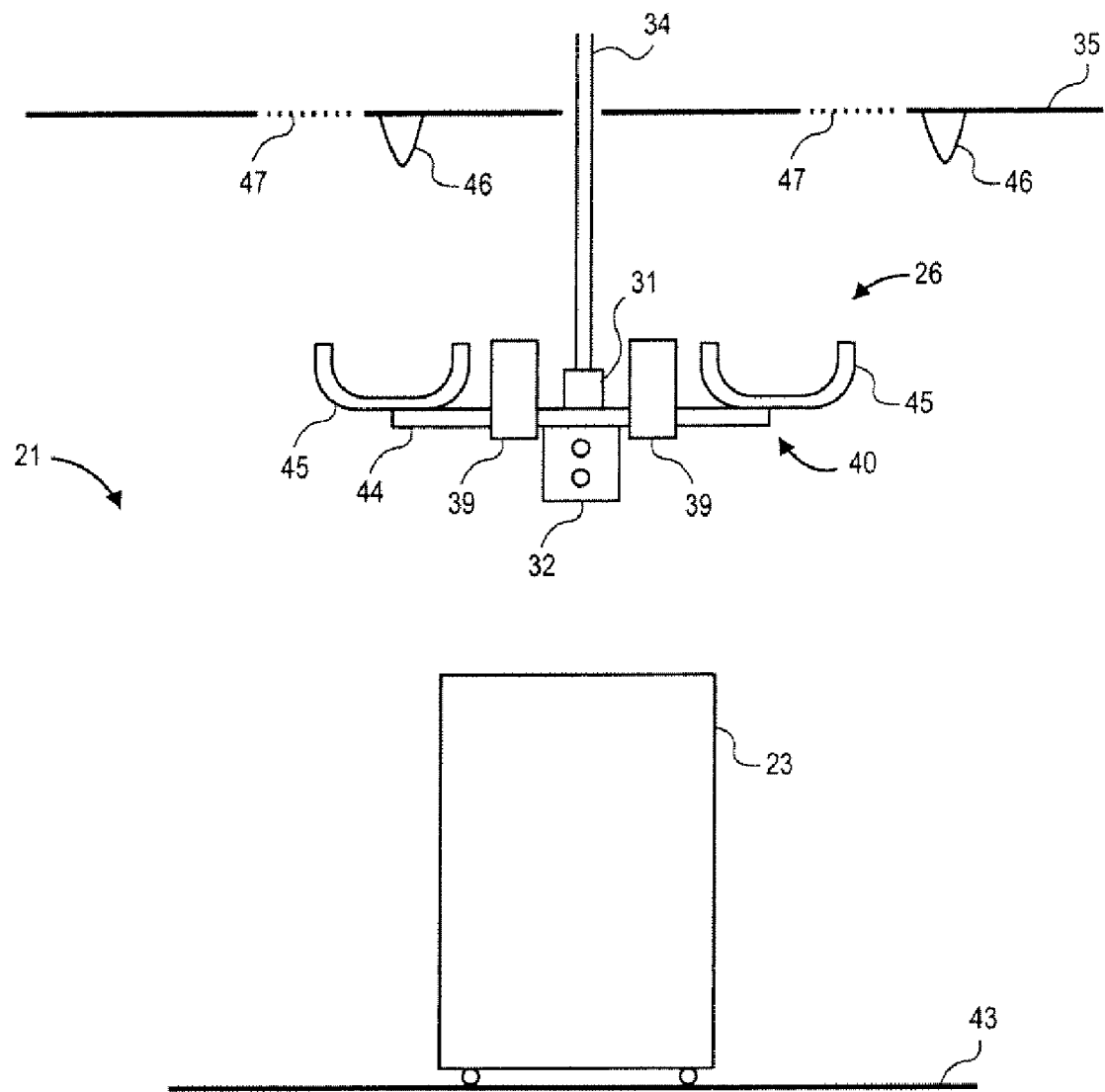
FIG. 3B shows an end-on view of the support structure shown in FIG. 3A.
Figure 4A:
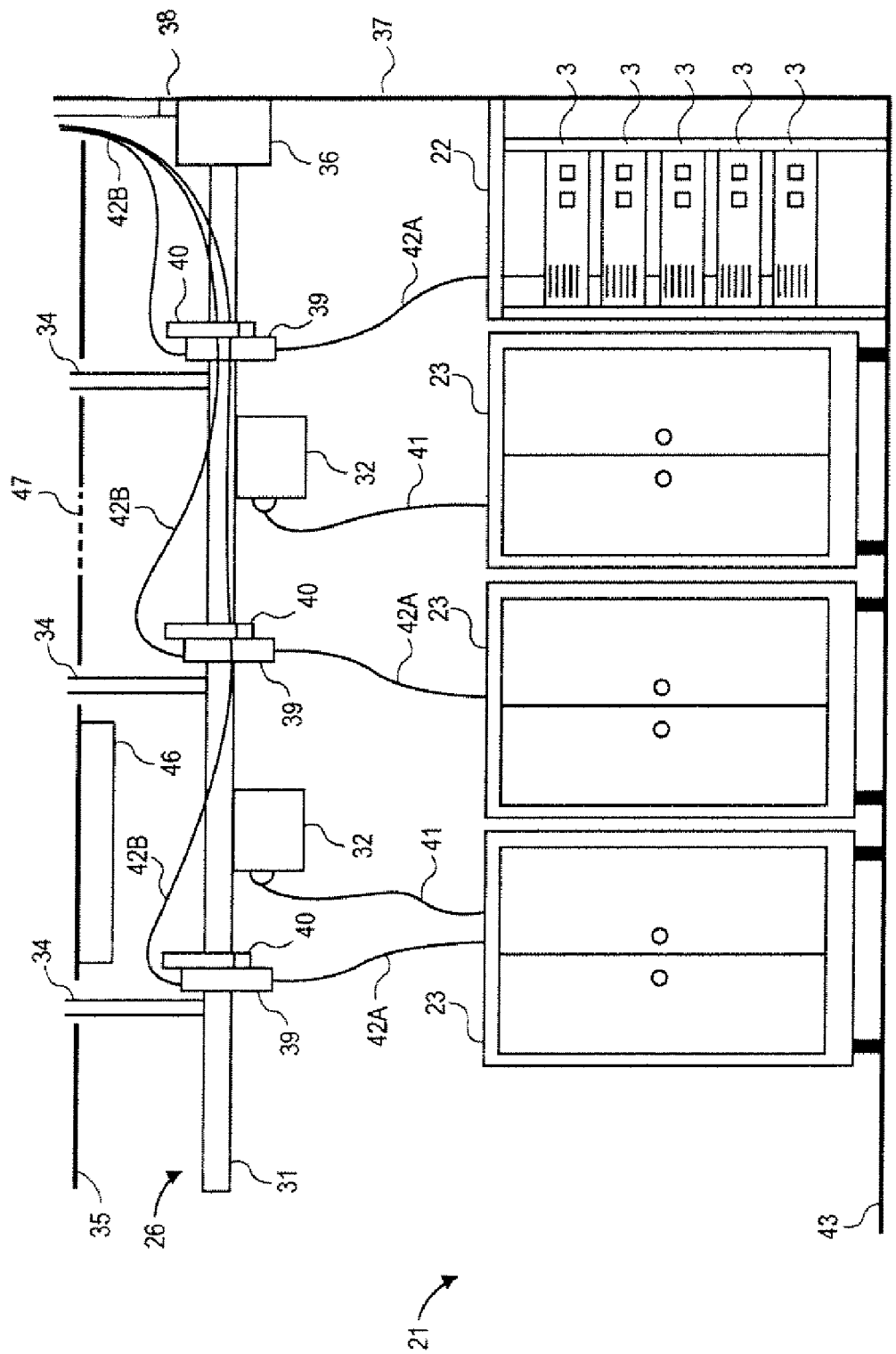
FIGS. 4A and 4B show essentially the same views as in FIGS. 3A and 3B, respectively, with the addition of power and data transmission cables.
Figure 4B:
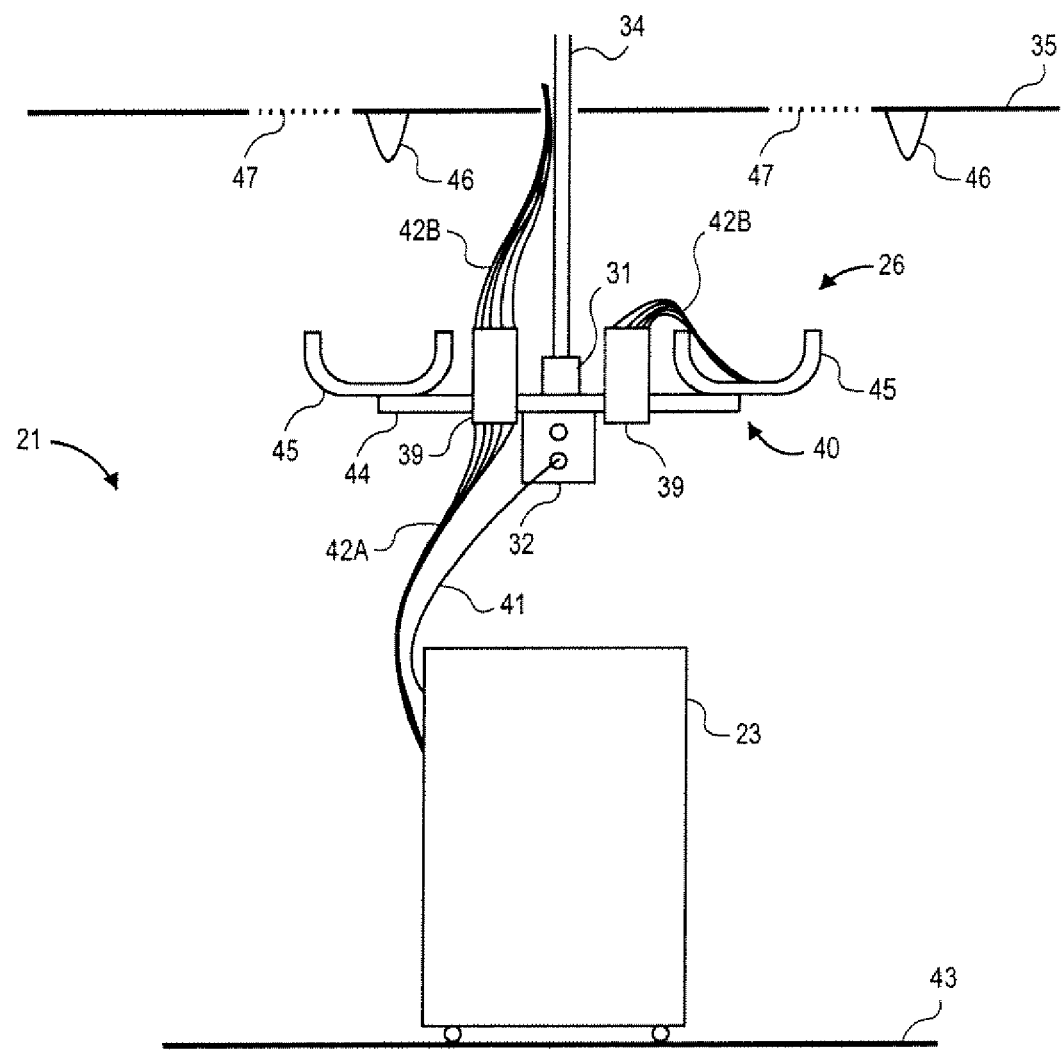

FIGS. 3A and 3B show a front and side view, respectively, of a work area 21 in the lab 1, including the power and data routing structure. FIGS. 4A and 4B are essentially the same as FIGS. 3A and 3B, respectively, with the addition of power cables 41 and data (networking) cables 42A and 42B in FIGS. 4A and 4B, such as may be seen in actual use. The power cables 41 and data (network) cables 42A and 42B are not shown in FIGS. 3A and 3B, to allow better visualization of certain elements.

The work area 21 includes a conventional fixed equipment rack 22 and several movable equipment cabinets 23, arranged adjacent to each other in a row. Various electronic devices 3 are stacked vertically in the rack 22 and (although not shown) in the equipment cabinets 23. The rack 22 may be used to hold devices that control and/or connect the other devices in the work area 21. For example, in a file server system, the rack 22 may contain one or more file server heads, which control disk drives mounted in the rack and/or in the cabinets 23. In contrast with other lab designs, equipment is not placed on a raised floor portion, and the equipment cabinets 23 are on rollers to facilitate repositioning of equipment within the lab 1.

The support structure for power and data routing includes a single overhead spine-and-rib structure 26 suspended over the equipment work area 21, parallel to the row of equipment. The structure 26 includes a horizontal bus duct segment 31 suspended over the row of electronic devices, which forms the "spine" of the spine-and-rib structure 26. As used herein, the term "bus duct" refers to any elongate, rigid conduit that includes one or more conductors disposed within it along its length and which allows electrical connection to be made to it at one or more locations. An example of bus duct such as this is the Starline B100 Series Busway, made by Universal Electric Corporation of Bridgeville, Pa.

Referring still to FIG. 3, multiple power outlet modules 32 are connected to the bottom side of the horizontal bus duct segment 31, to allow connection of power cables 41 that provide power to the electronic devices 3 in the work area. Assuming the bus duct segment 31 is Starline busway type bus duct, the power outlet modules 32 may be corresponding Starline B100 Busway Series plug-in units or the like.

The horizontal bus duct segment 31 is suspended from above by a number of vertical support members 34. The horizontal bus duct segment 31 is positioned at a height that is well overhead for most people, yet readily accessible purposes of modifications or repairs, e.g., at approximately eight feet above the floor 43. Each vertical support member 34 attaches to the horizontal bus duct segment 31 at its lower end and passes through a small aperture in the ceiling 35 to attach to an overall support structure (not shown) above the ceiling 35 at its upper end. For example, the upper ends of the vertical support members 34 may attach to beams, girders and/or concrete deck that form part of the building in which the lab is located. The vertical support members 34 may be, for example, Unistrut metal framing, such as made by Tyco/Unistrut Corporation of Wayne, Mich.

The horizontal bus duct segment 31 also connects to a bus duct end feed 36 attached to the wall 37 of the lab. The end feed 36 connects the horizontal bust duct segment 31 to other power conduit. Specifically, a vertical power conduit 38 is coupled to the horizontal bus duct segment 31 through the end feed 36 and runs vertically from the bus duct end feed 36 to additional power conduit (not shown) that traverses laterally above the ceiling and ultimately terminates in an electrical power wall panel (not shown), from which power is distributed throughout the lab 1.

A number of data line connectors 39 are also mounted to the horizontal bus duct segment 31, through a number of rib members 40. As shown in FIGS. 3B and 4B, each rib member 40 includes a horizontal member 44 with two U-shaped members 45 attached to it. Each of the data line connectors 39 is mounted to the horizontal member 44, adjacent to the horizontal bus duct segment 31.

Among other possible uses, the U-shaped members 45 provide a convenient structure to hang or route cables overhead, as shown in FIGS. 4A and 4B. Note that the U-shaped members 45 are optional, and any given rib member 40 may not necessarily have any U-shaped member 45 or may include a number of U-shaped members 45 other than two.

In certain embodiments, each data line connector 39 is a multiport RJ-45 or FC-type connector, which connects two groups of multiple data lines together. Specifically, each data line connector connects one group 42A of data lines (see FIGS. 4A and 4B) that couple directly to electronic devices 3 in the work area to a second group 42B of data lines that provides intermediate routing between devices in the work area 21 and/or between different work areas 21. The data lines 42A and 42B may be any conventional copper and/or optical fiber transmission lines. For example, to connect electrical data lines, the data line connectors 39 may be CBXF12WH-A connectors made by Panduit Corp. of Tinley Park, Ill., or other similar connectors. To connect optical fiber data lines, the data line connectors 39 may be M40A1-B-262 connectors made by Avaya Communications of Basking Ridge, N.J., or other similar connectors.

The above-described power and data routing structure 26 can be combined with efficient air-conditioning and lighting system design, to provide a highly advantageous overall lab design. The single spine-and-rib structure 26 takes up relatively little overhead space, so as not to substantially interfere with airflow to or from high-volume air-conditioning (HVAC) ceiling vents 47, or with illumination from ceiling-mounted light fixtures 46 (see FIGS. 2 through 4). The lighting fixtures 46 can be long and thin so as to require very little ceiling area. An example of lighting fixtures having these characteristics is the model COR200 lighting fixture made by Los Angeles Lighting of El Monte, Calif. This overall combination of power and data routing structure, air-conditioning, and lighting reduces operational individual clutter overhead in comparison to other known electronics lab designs.

Figure 5:
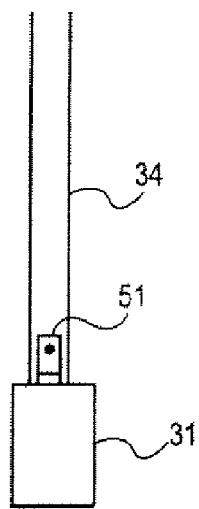
FIG. 5 shows two orthogonal views of the bus duct segment.
Figure 5:
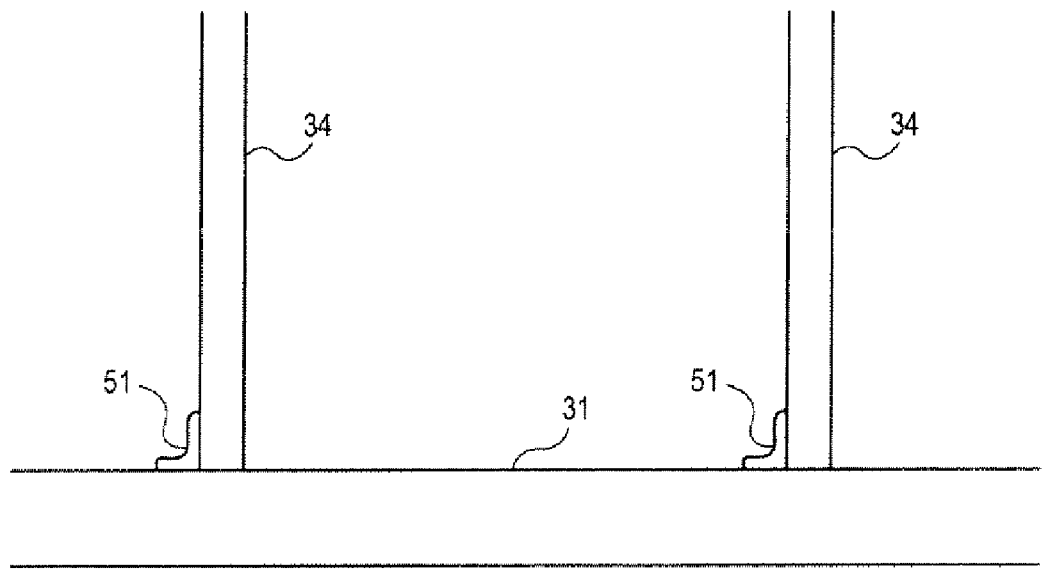
Figure 6:
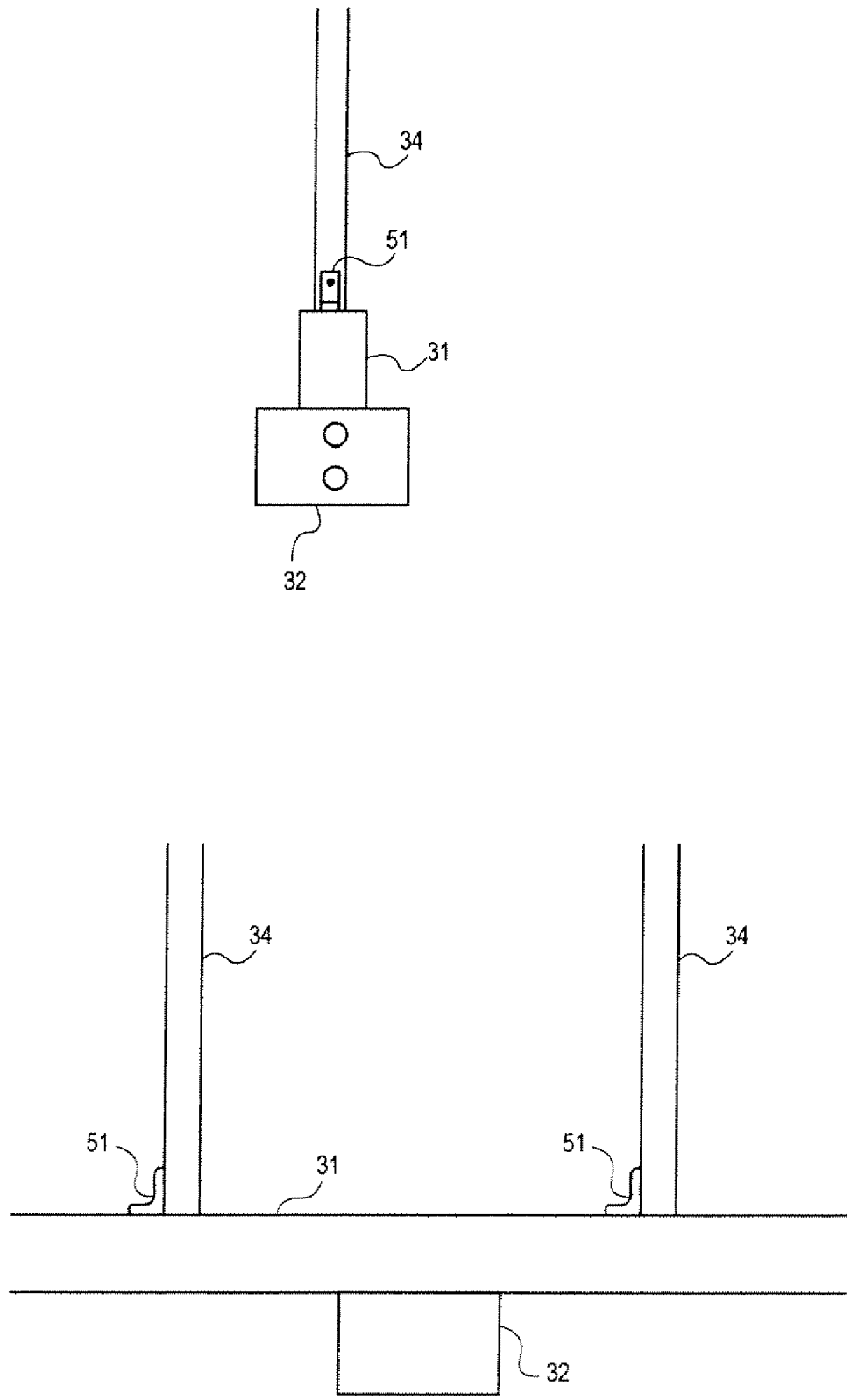
FIG. 6 shows two orthogonal views of the bus duct segment with power outlet modules mounted thereto.
Figure 7:
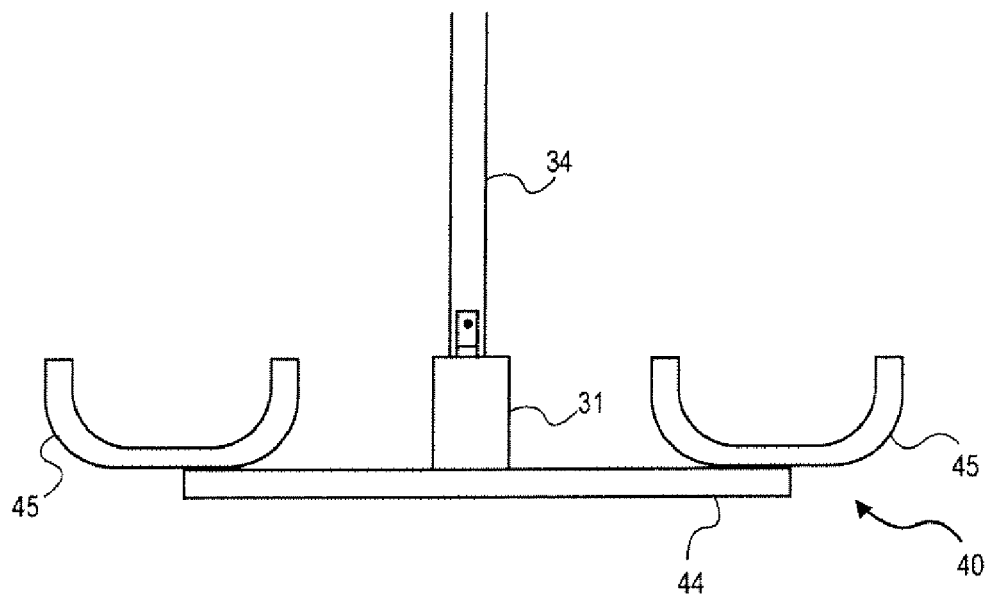
FIG. 7 shows two orthogonal views of the bus duct segment with rib members mounted thereto.
Figure 7:
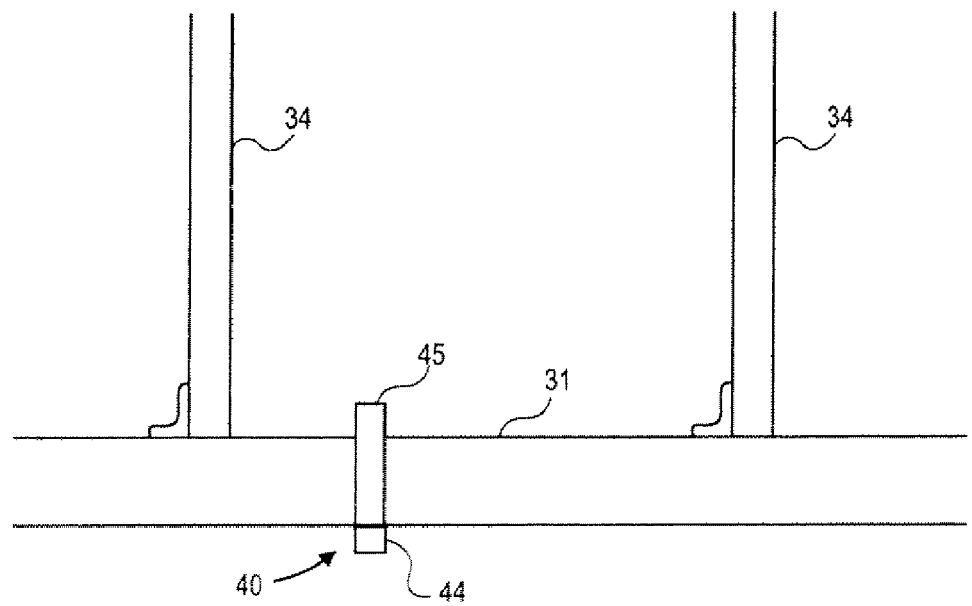
Figure 8:
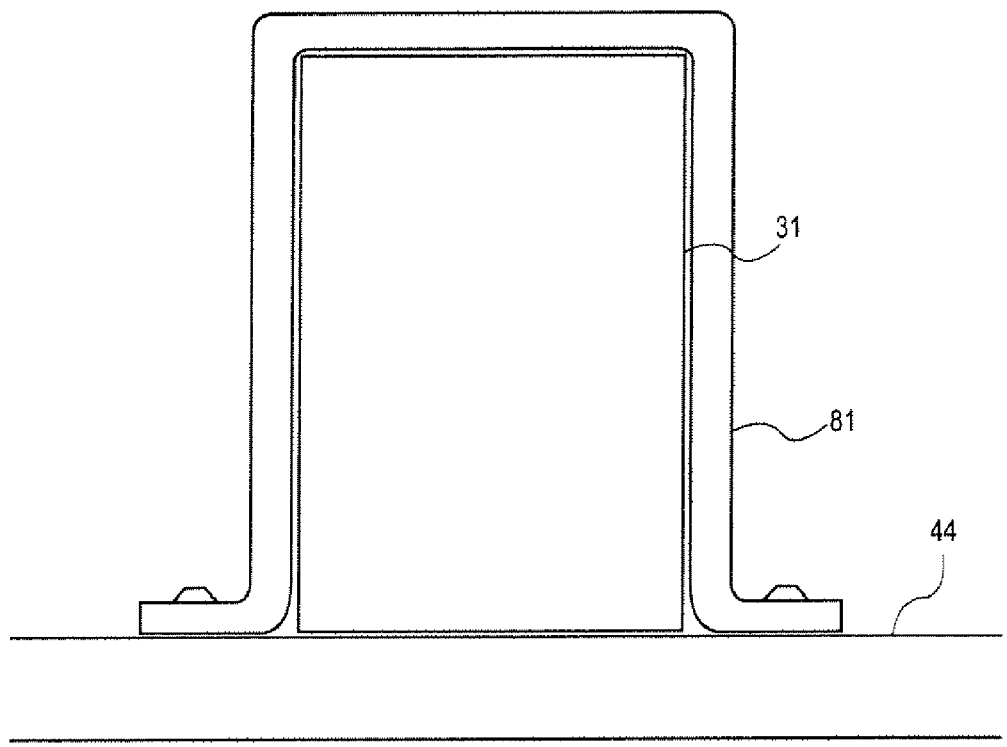
FIG. 8 shows two orthogonal views of the mounting of a rib member to the bus duct segment.
Figure 8:
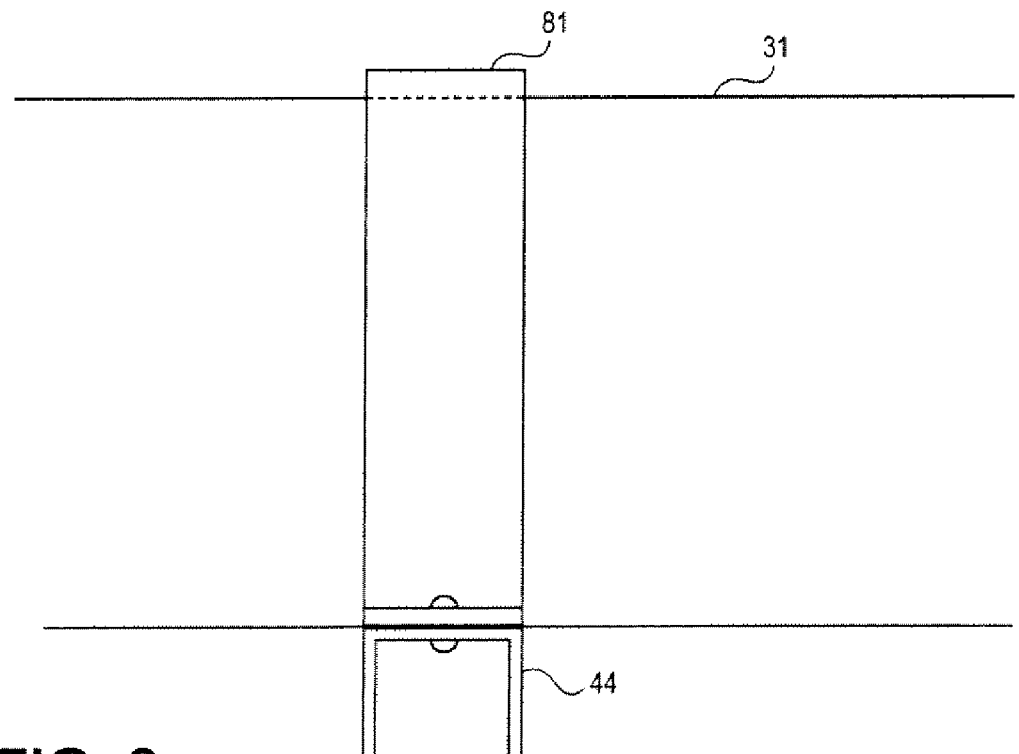
Figure 9:
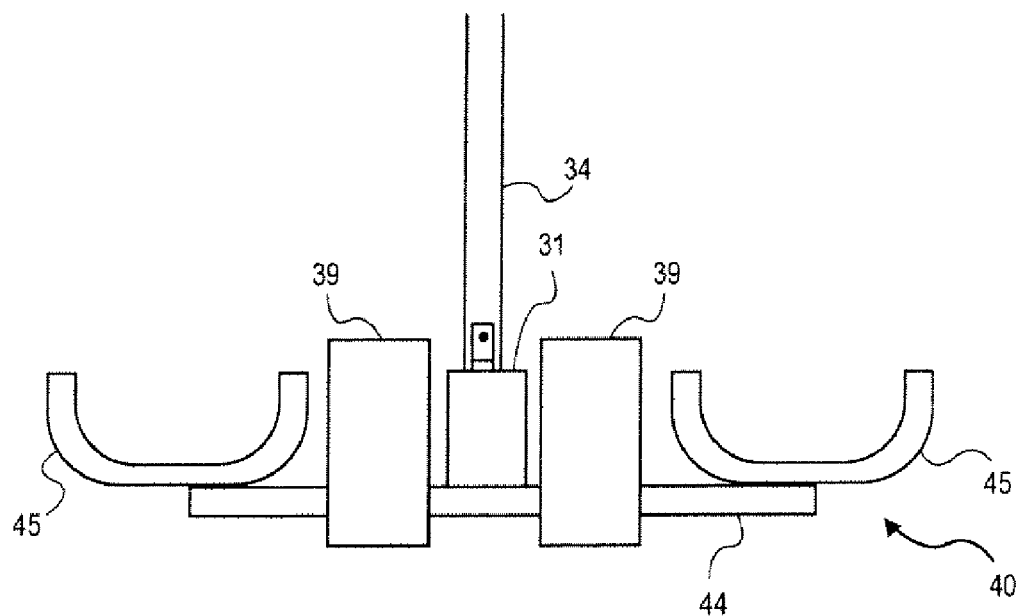
FIG. 9 shows two orthogonal views of the bus duct segment with rib members and data connectors mounted thereto.
Figure 9:
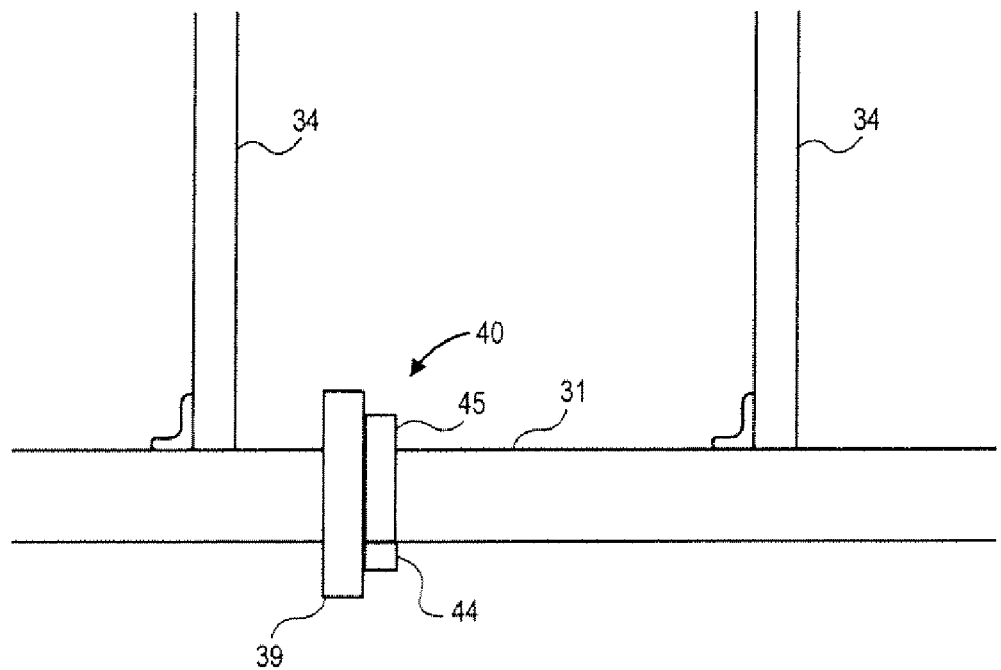

To provide a better understanding of the above described power and data routing structure 26, FIGS. 5 through 10 separately show different portions of the power and data routing structure 26, such as might be seen during assembly of the structure 26. FIG. 5 shows front and side views of the horizontal bus duct segment 31, attached to the vertical members 34. As shown, the horizontal bus duct segment 31 can be attached to each vertical member 34 by an ordinary L-bracket 51. FIG. 6 shows front and side views of the horizontal bus duct segment 31 with the power outlet modules 32 mounted to it. The power outlet modules 32 mount to existing ports (not shown) on the horizontal bus duct segment 31, in a manner specified by the manufacturer. FIG. 7 shows front and side views of the horizontal bus duct segment 31 with the rib members 40 mounted to it, but without the power outlet modules 32. FIG. 8 includes front and side views illustrating how the horizontal member 44 of each rib member 40 can be mounted to the bus duct segment 31 using a bracket 81. FIG. 9 shows the same views as FIG. 7, but with the data line connectors 39 mounted to the rib members 40.

Figure 10:
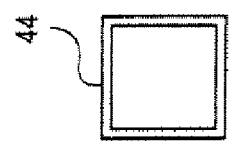
FIG. 10 shows two orthogonal views of the horizontal member of a rib member.
Figure 10:
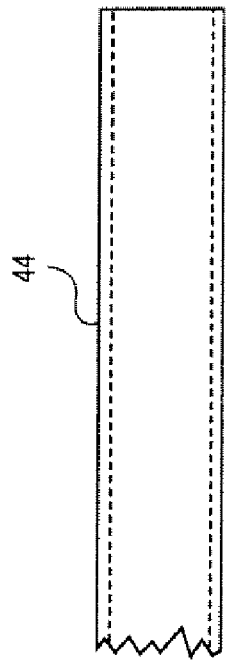
Figure 10:
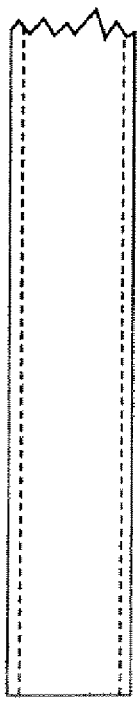
Figure 11:
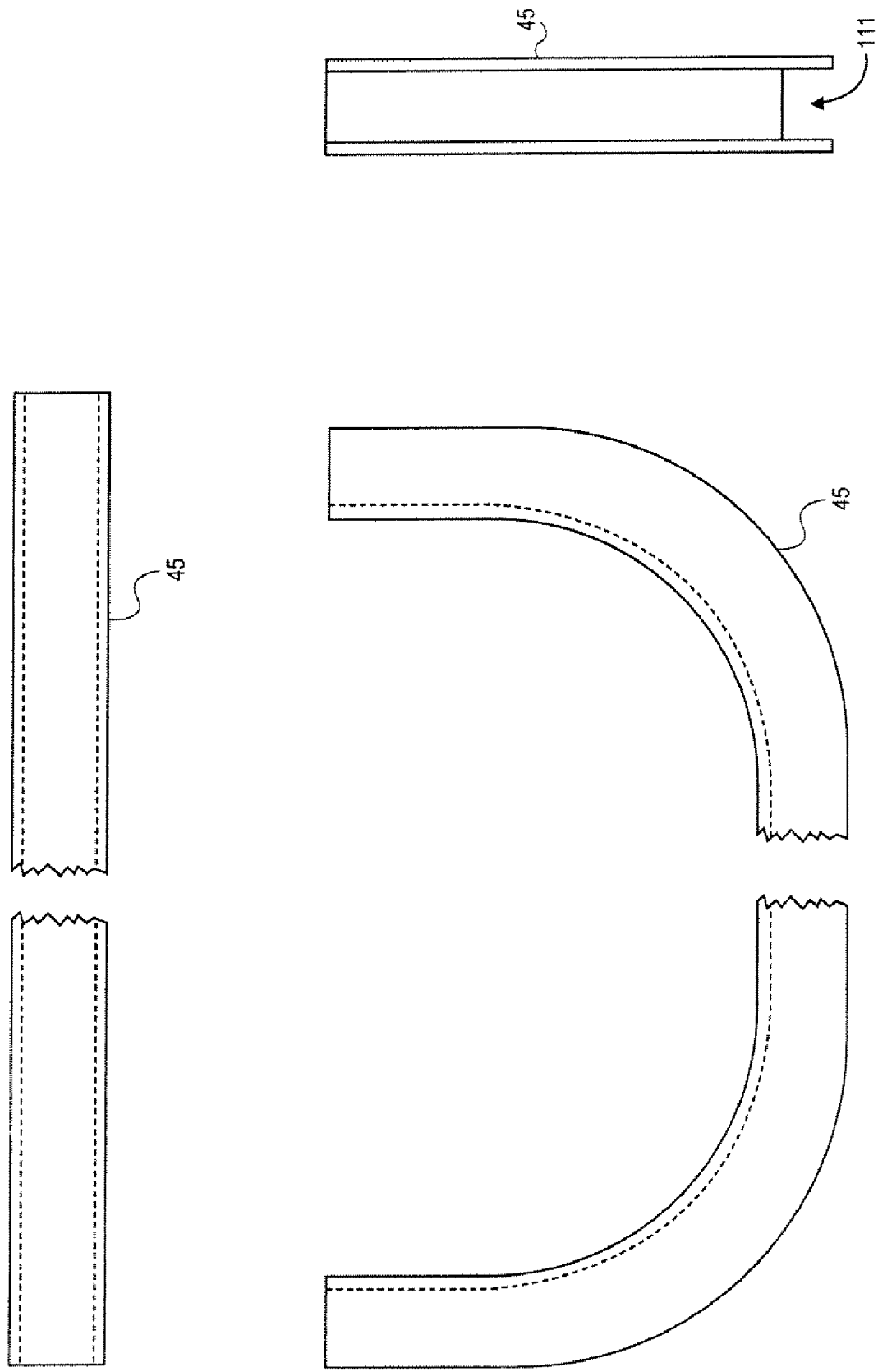
FIG. 11 shows three orthogonal views of a U-shaped member of a rib member.
Figure 12:
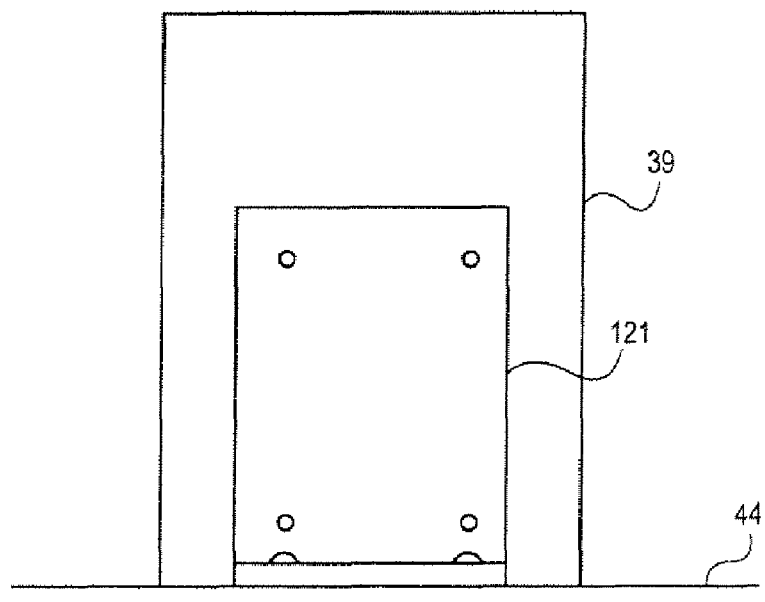
FIG. 12 shows two orthogonal views showing the mounting of a data line connector to a rib member.
Figure 12:
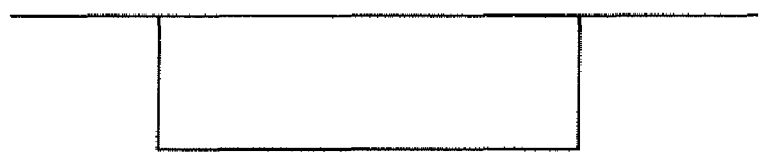
Figure 12:
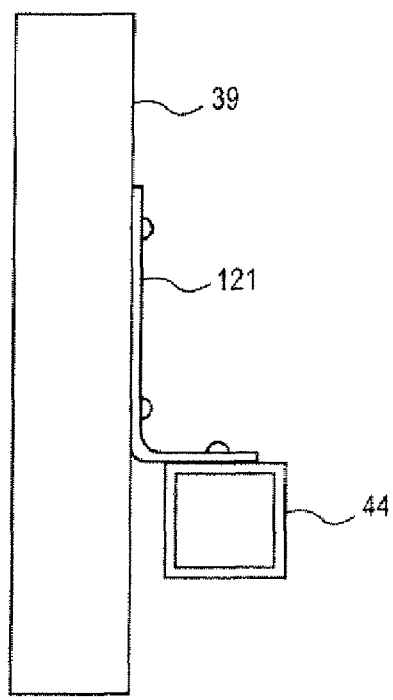

FIGS. 10 and 11 illustrate a rib member 40 in greater detail, and FIG. 12 shows how a data line connector 39 can be mounted to a rib member 40. Specifically, FIG. 10 shows two orthogonal views of the horizontal member 44 of the rib member 40. As shown, the horizontal member 44 is four-sided and hollow. In certain embodiments, the component members of the rib member 40 are each made from any conventional metal or metal alloy having strength and weight characteristics suitable for use in mechanical support structures, such as aluminum or stainless steel.

FIG. 11 shows three orthogonal views of the U-shaped member 45 of the rib member 40. The U-shaped member 45 can be made of metal or metal alloy and, as shown, is extruded so that one of its surfaces forms a slot 111. The slot 111 adds stability without adding relatively little weight. The slot 111 faces the horizontal member 44 when the U-shaped 45 member and the horizontal member 44 are coupled together. Referring to FIG. 12, a data line connector 39 can be mounted to a horizontal member 44 of a rib member 40 using a simple L-bracket 121.

From the foregoing description, it can be seen that the power and data routing infrastructure described above provides numerous advantages. For example, the structure is cost effective from both an initial and ongoing cost standpoint. The single overhead spine-and-rib approach is more space efficient and less expensive than an structure that uses two separate spines for power and data. The power and data routing structure described below allows power and data conductors to be run at essentially the same optimal height, enabling easy service by technicians while avoiding floor clutter and reducing ceiling clutter compared to prior systems. The modular nature of the structure also allows power and data modules to be easily changed or added, making the overall routing configuration of the lab highly flexible. The structure also allows more room and flexibility for lighting and air conditioning placement.

Thus, a modular electronics lab with improved infrastructure for routing power and network data has been described. Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense.

What is claimed is:

1. A structure comprising:
   a bus duct segment suspended above a plurality of interconnected electronic devices, to transfer power to at least one of the electronic devices;
   a plurality of power outlet modules mounted to the bus duct segment, each including an outlet to which a power cable can be connected;
   a plurality of rigid members mounted to the bus duct segment; and a plurality of data line connectors, each mounted to a separate one of the rigid members, each of the data line connectors to couple a first data line to a second data line, to transport data between two or more of the electronic devices.

2. A structure as recited in claim 1, wherein the plurality of rigid members are distributed along the length of the bus duct segment, each mounted horizontally to the bus duct segment in an orientation transverse to a length of the bus duct segment.

3. A structure as recited in claim 2, wherein each of the rigid members comprises:
   a first elongate member mounted to the bus duct segment; and
   a substantially U-shaped member coupled to the first elongate member.

4. A structure as recited in claim 2, wherein the plurality of rigid members are interspersed with the plurality of power outlet modules along the length of the bus duct segment.

5. A structure as recited in claim 1, wherein each of the plurality of data line connectors is a multi-port data line connector, each to couple a first plurality of data lines to a second plurality of data lines external to the bus duct segment, to transport data between the electronic devices.

6. A structure as recited in claim 1, wherein the plurality of interconnected electronic devices comprises a plurality of mass storage systems.

7. A structure as recited in claim 1, wherein each of the plurality of data line connectors is a multi-port data line connector, each to couple a first plurality of data lines to a second plurality of data lines external to the bus duct segment, to transport data between the electronic devices.

8. A structure as recited in claim 1, wherein the plurality of interconnected electronic devices comprises a plurality of mass storage systems.

9. A structure to transfer power and network data traffic to a plurality of interconnected electronic devices, the structure comprising
   a bus duct segment suspended above the plurality of electronic devices, the bus duct segment including a power conductor coupled to a power source;
   a plurality of power outlet modules mounted to the bus duct segment, each coupled to the power conductor and including an outlet to which a power cable can be connected;
   a plurality of rigid members mounted to the bus duct segment; and
   a plurality of data line connectors, each mounted to a separate one of the rigid members adjacent to the bus duct segment, each to couple a first data line to a second data line, to transport data between two or more of the electronic devices.

10. A structure as recited in claim 9, wherein the plurality of rigid members are distributed along the length of the bus duct segment, each mounted horizontally to the bus duct segment in an orientation transverse to a length of the bus duct segment.

11. A structure as recited in claim 10, wherein the plurality of rigid members are interspersed with the plurality of power outlet modules along the length of the bus duct segment.

12. A structure as recited in claim 9, wherein each of the rigid members comprises:
   a first elongate member mounted to the bus duct segment; and
   a substantially U-shaped member coupled to the first elongate member.

13. A structure as recited in claim 9, wherein each of the plurality of data line connectors is a multi-port data line connector, each to couple a first plurality of data lines to a second plurality of data lines external to the bus duct segment, to transport data between the electronic devices.

14. A structure as recited in claim 9, wherein the plurality of interconnected electronic devices comprises a plurality of mass storage systems.

15. A structure to transfer power and data traffic to a plurality of interconnected electronic devices arranged in a row, the structure comprising:
   an elongate bus duct segment suspended horizontally above the plurality of electronic devices from an overhead structure substantially parallel to said row, the bus duct segment including a power conductor disposed along a length of the bus duct segment, the power conductor electrically coupled to a power source;
   a plurality of power outlet modules mounted to the bus duct segment and distributed along the length of the bus duct segment, each of the power outlet modules electrically coupled to the power conductor and including an outlet to which a power cable can be connected to provide power to at least one of the electronic devices;
   a plurality of elongate rigid members distributed along the length of the bus duct segment, each mounted horizontally to the bus duct segment in an orientation transverse to the length of the bus duct segment; and
   a plurality of multiport data line connectors, each mounted to a separate one of the rigid members adjacent to the bus duct segment, each of the multi-port data line connectors to couple a first plurality of data lines to a second plurality of data lines external to the bus duct segment, to transport data between two or more of the electronic devices.

16. A structure as recited in claim 15, wherein each of the elongate rigid members comprises:
   a first elongate member mounted to the bus duct segment; and
   a substantially U-shaped member coupled to the first elongate member.

17. A structure as recited in claim 15, wherein the plurality of interconnected electronic devices comprises a plurality of mass storage systems.

18. A system comprising:
   a first plurality of interconnected electronic devices arranged in a first row; and
   a first power and data distribution structure, suspended above the first plurality of interconnected electronic devices, to distribute power and data traffic to the first plurality of electronic devices, the first power and data distribution structure including
   a bus duct segment suspended above the first plurality of electronic devices substantially parallel to the first row, the bus duct segment including a power conductor coupled to a power source;
   a plurality of power outlet modules mounted to the bus duct segment, each coupled to the power conductor and including an outlet to which a power cable can be connected;
   a plurality of rigid members mounted to the bus duct segment; and
   a plurality of data line connectors, each mounted to a separate one of the rigid members adjacent to the bus duct segment, each to couple a first data line to a second data line, to transport data between two or more of the first plurality of electronic devices.

19. A structure as recited in claim 18, further comprising:
- a second plurality of interconnected electronic devices arranged in a second row, in proximity to the first plurality of interconnected electronic devices; and
- a second power and data distribution structure, substantially identical to the first power and data distribution structure, suspended above the second plurality of interconnected electronic devices, to distribute power and data traffic to the second plurality of electronic devices, wherein the bus duct segment of the second power and data distribution structure is disposed substantially parallel to the second row.

20. A structure as recited in claim 19, wherein the first plurality of interconnected electronic devices is coupled to the second plurality of interconnected electronic devices.

21. A structure as recited in claim 18, wherein the plurality of interconnected electronic devices comprises a plurality of mass storage systems.

22. A structure as recited in claim 18, wherein the plurality of rigid members are distributed along the length of the bus duct segment, each mounted horizontally to the bus duct segment in an orientation transverse to a length of the bus duct segment.

23. A structure as recited in claim 22, wherein the plurality of rigid members are interspersed with the plurality of power outlet modules along the length of the bus duct segment.

24. A structure as recited in claim 18, wherein each of the rigid members comprises:
- a first elongate member mounted to the bus duct segment; and
- a substantially U-shaped member coupled to the first elongate member.

25. A structure as recited in claim 18, wherein each of the plurality of data line connectors is a multi-port data line connector, each to couple a first plurality of data lines to a second plurality of data lines external to the bus duct segment, to transport data between the electronic devices.

26. A structure comprising:
- a bus duct segment suspended above a plurality of interconnected electronic devices, to transfer power to at least one of the electronic devices;
- a plurality of rigid members mounted to the bus duct segment; and
- a plurality of data line connectors, each mounted to a separate one of the rigid members, each of the data line connectors to couple a first data line to a second data line, to transport data between two or more of the electronic devices.

27. A structure as recited in claim 26, wherein the plurality of rigid members are distributed along the length of the bus duct segment, each mounted horizontally to the bus duct segment in an orientation transverse to a length of the bus duct segment.

28. A structure as recited in claim 27, wherein each of the rigid members comprises:
- a first elongate member mounted to the bus duct segment; and
- a substantially U-shaped member coupled to the first elongate member.

29. A structure as recited in claim 27, further comprising a plurality of power outlet modules mounted to the bus duct segment, each including an outlet to which a power cable can be connected, wherein the plurality of rigid members are interspersed with the plurality of power outlet modules along the length of the bus duct segment.

30. A structure as recited in claim 26, further comprising a plurality of power outlet modules mounted to the bus duct segment, each including an outlet to which a power cable can be connected.

* * * * *